United States Patent
Jin et al.

(10) Patent No.: US 6,787,393 B2
(45) Date of Patent: Sep. 7, 2004

(54) SEMICONDUCTOR PACKAGE INCLUDING A DOUBLE-FACED SEMICONDUCTOR CHIP HAVING INTEGRATED CIRCUITRY ON BOTH SIDES THEREOF AND A METHOD OF FABRICATING THE SEMICONDUCTOR PACKAGE

(75) Inventors: Ho-tae Jin, Cheonan (KR); Heui-seog Kim, Cheonan (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/370,624

(22) Filed: Feb. 24, 2003

(65) Prior Publication Data

US 2003/0189250 A1 Oct. 9, 2003

(30) Foreign Application Priority Data

Apr. 8, 2002 (KR) ........................................ 2002-19035

(51) Int. Cl.[7] .................. H01L 21/44; H01L 21/48; H01L 21/50
(52) U.S. Cl. .................. 438/112; 438/106; 438/107; 438/110; 438/111; 438/112; 438/123; 257/668; 257/666; 257/787; 257/784
(58) Field of Search .................. 438/112, 124, 438/106, 107, 110, 123, 111; 257/668, 666, 787

(56) References Cited

U.S. PATENT DOCUMENTS

| 6,118,176 A | * | 9/2000 | Tao et al. | ................. 257/676 |
| 6,150,708 A | | 11/2000 | Gardner et al. | ............. 257/618 |
| 6,521,980 B1 | * | 2/2003 | Tandy et al. | ................ 257/668 |

* cited by examiner

*Primary Examiner*—Eddie Lee
*Assistant Examiner*—Nitin Parekh
(74) *Attorney, Agent, or Firm*—Lee & Sterba, P.C.

(57) ABSTRACT

A semiconductor package including a double-faced semiconductor chip having integrated circuitry on both sides thereof, and a method of fabricating the same is provided, wherein the semiconductor package includes the semiconductor chip; a lead-on-chip (LOC)-type substrate, having metal patterns on both sides, bonded with the first side of the semiconductor chip; first wires for connecting the first side of the semiconductor chip to the second side of the LOC-type substrate; second wires for connecting the second side of the semiconductor chip to the first side of the LOC-type substrate; a first sealing material for covering the semiconductor chip, the first wires, and the second side of the LOC-type substrate; a second sealing material for covering the semiconductor chip, the second wires, and the first side of the LOC-type substrate; and solder balls attached to the second side of the LOC-type substrate.

12 Claims, 4 Drawing Sheets

SEMICONDUCTOR PACKAGE INCLUDING A DOUBLE-FACED SEMICONDUCTOR CHIP HAVING INTEGRATED CIRCUITRY ON BOTH SIDES THEREOF AND A METHOD OF FABRICATING THE SEMICONDUCTOR PACKAGE

BACKGROUND OF THE INVENTION

1. Field of the Invention

The present invention relates to a semiconductor device. More particularly, the present invention relates to a semiconductor package including a double-faced semiconductor chip having integrated circuitry on both sides thereof and a method of fabricating the semiconductor package.

2. Description of the Related Art

Semiconductor packages are used in a wide range of information technology related devices, such as computers, mobile phones and network equipment, as well as electronic appliances. In particular, in the information industry, a semiconductor package is required to be thin, compact, multi-functional, easy to manufacture by combining at least two semiconductor chips, and able to operate at high speed.

To satisfy these requirements, semiconductor packages called multi-chip packages (MCPs) are fabricated by assembling at least two semiconductor chips. MCPs are made by stacking either two different semiconductor chips or two completed semiconductor packages. However, because two different semiconductor chips or different semiconductor packages are physically bonded together, they are prone to separating from each other or a void may occur at an interface between them. In addition, when combining two different semiconductor chips having bonding pads at the centers of the chips, it is difficult to satisfactorily perform wire bonding thereon. For these reasons, the quality and reliability of MCPs are lowered. Further, because MCPs are made of two different semiconductor chips or different semiconductor packages, there is a limit as to how much the size and volume of an MCP may be reduced.

SUMMARY OF THE INVENTION

In an effort to solve the above-described problems, it is a first feature of an embodiment of the present invention to provide a semiconductor package that is manufactured using a semiconductor chip having integrated circuitry on both sides thereof, thus being compact, thin, multi-functional, and capable of operating at high speed.

It is a second feature of an embodiment of the present invention to provide a method of fabricating such a semiconductor package.

Accordingly, to provide the first feature of an embodiment of the present invention, there is provided a semiconductor package including a double-faced semiconductor chip having a first and a second side, the semiconductor package including a semiconductor chip having integrated circuitry on the first and second sides thereof; a lead-on-chip (LOC)-type substrate having a first and a second side and metal patterns on both sides thereof, which is bonded with the first side of the semiconductor chip with an adhesive; a plurality of first wires, each for connecting a bonding pad on the first side of the semiconductor chip to the metal pattern on the second side of the LOC-type substrate; a plurality of second wires, each for connecting a bonding pad on the second side of the semiconductor chip to the metal pattern on the first side of the LOC-type substrate; a first sealing material for covering a portion of the first side of the exposed semiconductor chip, the plurality of first wires, and a portion of the second side of the LOC-type substrate on the center of an upper portion of the LOC-type substrate; a second sealing material for covering the semiconductor chip, the plurality of second wires, and the first side of the LOC-type substrate on a lower portion of the LOC-type substrate; and solder balls attached to the second side of the LOC-type substrate.

Preferably, the bonding pad is formed at a center of the integrated circuitry formed on the first side of the semiconductor chip and formed at an edge of the integrated circuitry formed on the second side of the semiconductor chip.

The integrated circuitry formed on the first and second sides of the semiconductor chip may have the same function or may have different functions.

Preferably, the LOC-type substrate is formed of polyimide tape. The adhesive that bonds the semiconductor chip with the LOC-type substrate is preferably formed of elastomer. Additionally, the first sealing material may be liquid encapsulant. The second sealing material may be epoxy mold compound. Preferably, each of the metal patterns on the first and second sides of the LOC-type substrate is a bonding finger.

To provide the second feature of an embodiment of the present invention, there is provided a method of fabricating a semiconductor package including a double-faced semiconductor chip having a first and a second side, the method including preparing a semiconductor chip, wherein the semiconductor chip has integrated circuitry on the first and second sides thereof; attaching a lead-on-chip (LOC)-type substrate having a first and a second side, and metal patterns on both sides thereof, to the first side of the semiconductor chip with an adhesive; performing wire bonding in which a bonding pad on the second side of the semiconductor chip is connected to the metal pattern on the first side of the LOC-type substrate, with one of a plurality of second wires; performing a first sealing process in which a second sealing material is applied to the semiconductor chip, the plurality of second wires, and the first side of the LOC-type substrate; performing wire bonding in which a bonding pad on the first side of the semiconductor chip, which is exposed by the LOC-type substrate, is connected to the metal pattern on the second side of the LOC-type substrate, with one of a plurality of first wires; performing a second sealing process in which a first sealing material is applied to the exposed first side of the semiconductor chip, the plurality of first wires, and a portion of the second side of the LOC-type substrate; and attaching solder balls to the second side of the LOC-type substrate.

Preferably, the first sealing process using the second sealing material is carried out using molding equipment. Preferably, the second sealing process using the first sealing material is carried out using a dispenser.

Preferably, after attaching the solder balls, the method further includes performing a marking process on the surface of the second sealing material.

In addition, after performing the marking process, the method further includes performing a singulation process of separating a plurality of LOC-type substrates that are combined with one another in a strip. Preferably, each of the metal patterns on the first and second sides of the LOC-type substrate is a bonding finger.

According to the present invention, it is possible to fabricate a semiconductor package that is compact, thin and multi-functional, and has characteristics of high-density, high-quality and high-reliability.

BRIEF DESCRIPTION OF THE DRAWINGS

The above and other features and advantages of the present invention will become readily apparent to those of ordinary skill in the art by describing in detail preferred embodiments thereof with reference to the attached drawings in which.

DETAILED DESCRIPTION OF THE INVENTION

Figure 1:
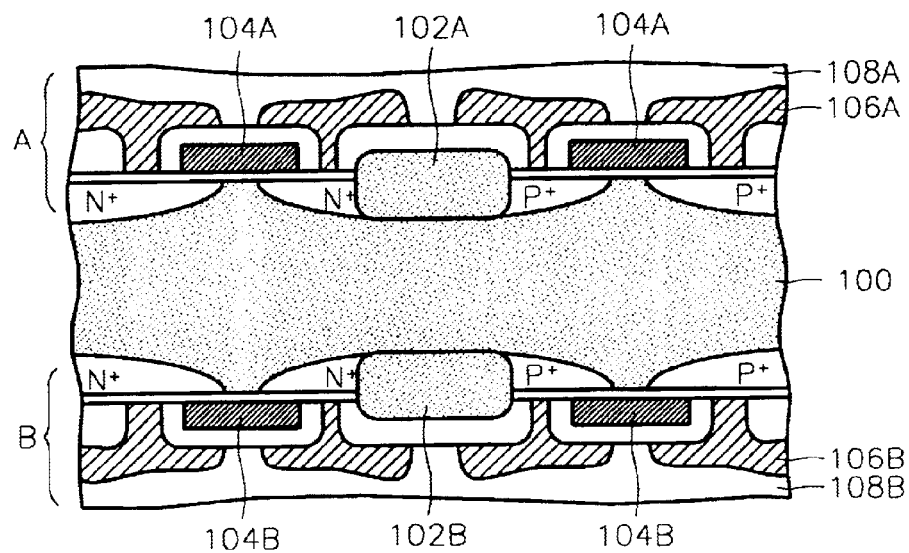
FIG. 1 illustrates a cross-sectional view of a double-faced semiconductor chip having integrated circuitry on both sides thereof.

Korean Patent Application No. 02-19035, filed Apr. 8, 2002, and entitled: "Semiconductor Package Made Using Semiconductor Chip Having Integrated Circuitry at Both of its Sides, and Method of Manufacturing the Same," is incorporated by reference herein in its entirety.

The present invention will now be described more fully hereinafter with reference to the accompanying drawings, in which a preferred embodiment is shown. In this preferred embodiment, a semiconductor chip is described as an inclusive term, and is not intended to be limited to one having specific functions, such as a memory. The present invention may be embodied in many different forms and should not be construed as being limited to the embodiment set forth herein. Rather, this embodiment is provided so that this disclosure will be thorough and complete, and will fully convey the concept of the invention to those of ordinary skilled in the art. For instance, in this preferred embodiment, semiconductor integrated circuitry is described as a device that functions as a memory unit on both sides of a semiconductor chip, but it may be embodied as a device that functions as a LOGIC circuit or as an application specific integrated circuit (ASIC). Further, first wires are formed of gold wire, but may also be in the form of a solder bump. In addition, a bonding unit that bonds a semiconductor chip with a lead-on-chip (LOC)-type substrate is formed of elastomer, but it may be formed of other materials, e.g., epoxy or adhesive tape. In the drawings, the thickness of layers and regions may be exaggerated for clarity. It will also be understood that when a layer is referred to as being "on" another layer or a substrate, it may be directly on the other layer or the substrate, or intervening layers may also be present. Like reference numerals in different drawings refer to like elements throughout.

FIG. 1 illustrates a cross-sectional view of a semiconductor chip 100 having integrated circuitry on both sides thereof. In general, a semiconductor chip has integrated circuitry on only one side, whereas the semiconductor chip 100 according to the present invention has integrated circuitry on both sides, i.e., a first side A and a second side B, thereby increasing integration density. The first side A includes a field oxide 102A, a gate electrode 104A, a metal layer 106A, and a passivation layer 108A. The second side B includes a field oxide 102B, a gate electrode 104B, a metal layer 106B, and a passivation layer 108B.

To form integrated circuitry on both sides of a semiconductor chip, while processing one side of a semiconductor chip, a blocking layer, such as a photoresist, is applied onto the unprocessed opposite side to protect it from outer shocks, such as heat or pressure, caused during the process.

If a semiconductor chip such as a 256 Mega DRAM is processed to have integrated circuitry on both sides thereof using the above method, a capacity of the semiconductor chip becomes 512 Mega, that is, the integration density thereof doubles. Further, it is possible to manufacture the semiconductor chip 100 having multiple functions by forming integrated circuitry, such as dynamic random access memory (DRAM), on the first side A and forming different integrated circuitry, such as static random access memory (SRAM), non-volatile memory (NVM) or an application specific integrated circuit (ASIC), on the second side B.

Such a double-faced semiconductor chip 100 is very useful in that it may be packaged using integrated circuitry on the second side B even if the first side A is ruined during an electric die sorting (EDS) process, thereby increasing yield.

<Structure of a Semiconductor Package>

Figure 2:
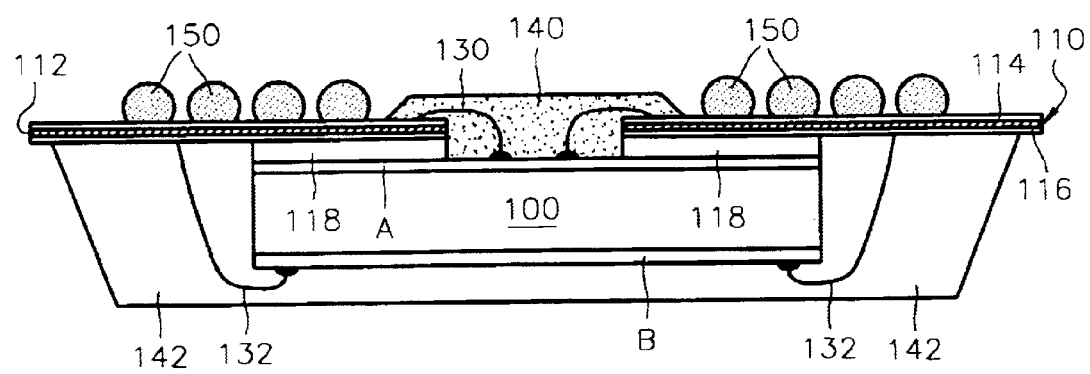
FIG. 2 illustrates a cross-sectional view of a semiconductor package including a double-faced semiconductor chip according to an embodiment of the present invention.

Hereinafter, a structure of a semiconductor package including a double-faced semiconductor chip 100, as shown in FIG. 1, will be described with reference to FIGS. 1 and 2. Referring to FIG. 2, the semiconductor package includes the semiconductor chip 100 having integrated circuitry on both sides thereof, i.e., the first and second sides A and B, a lead-on-chip (LOC)-type substrate 110 bonded with the first side A, first wires 130, second wires 132, a first sealing material 140, and a second sealing material 142.

The semiconductor chip 100 includes two different bonding pads (not shown) on both of the first and second sides, i.e., a center-type bonding pad on the first side A and an edge-type bonding pad on the second side B.

Additionally, one of a memory unit, an ASIC, a microcontroller unit (MCU) or a LOGIC may be formed as integrated circuitry on both the first and second sides A and B, or different types of integrated circuitry may be formed on each side. For instance, if the semiconductor chip 100 has the same memory unit on each side, an integration density thereof doubles, whereas if the semiconductor chip 100 has two different integrated circuitries on each side, functions of the semiconductor chip may be diversified.

The LOC-type substrate 110 consists of a tape 112 of polyimide having a first side 116 and a second side 114, the first side facing the semiconductor chip 100. The first 116 and second 114 sides of the tape 112 are covered with metal patterns. Additionally, the center of the LOC-type substrate 110 has an opening, through which wire bonding is to be performed on the center bonding pad type semiconductor chip 100. The metal pattern on the first side 116 of the LOC-type substrate 110 is bonded with the semiconductor chip 100 with an adhesive 118, such as an elastomer.

The other metal pattern on the second side 114 of the LOC-type substrate 110, e.g., a bonding finger, is connected to a bonding pad (not shown) on the center of the exposed first side A of the semiconductor chip 100, which is exposed through the opening in the LOC-type substrate 110, with the first wires 130. The remaining portion of the exposed first side A, the first wires 130, and a portion of the second side 114 of the LOC-type substrate 110 are covered with the first sealing material 140, such as liquid encapsulant, which protects those components from external shocks.

The metal pattern on the first side 116 of the LOC-type substrate 110, i.e., the bonding finger, is connected to a bonding pad (not shown) on the edge of the second side B of the semiconductor chip 100 via the second wires 132. The semiconductor chip 100, the second wires 132, and the first side 116 of the LOC-type substrate 110 are covered with the second sealing material 142, such as epoxy mold compound (EMC), which protects those components from external shocks.

Lastly, the metal pattern on the second side 114 of the LOC-type substrate 110 is connected to solder balls 150. The solder balls 150 function as connectors that connect a semiconductor package including a double-faced semiconductor chip to an external circuit such as a printed circuit board (PCB).

As previously mentioned, a semiconductor package according to the present invention is manufactured including one double-faced semiconductor chip. Accordingly, the semiconductor package is considerably thinner and more compact than conventional packages, while having the same functions as a conventional semiconductor package made of two different semiconductor chips or different semiconductor packages. Further, by using a single semiconductor chip, it is possible to solve problems of a conventional semiconductor package, e.g., delamination caused by poor adhesion or the occurrence of voids between two different semiconductor chips or semiconductor packages. Accordingly, the quality and reliability of a semiconductor package according to the present invention may be increased.

<Method of Fabricating a Semiconductor Package>

FIGS. 3 through 9 illustrate cross-sectional views explaining stages in a method of fabricating the semiconductor package shown in FIG. 2.

Figure 3:
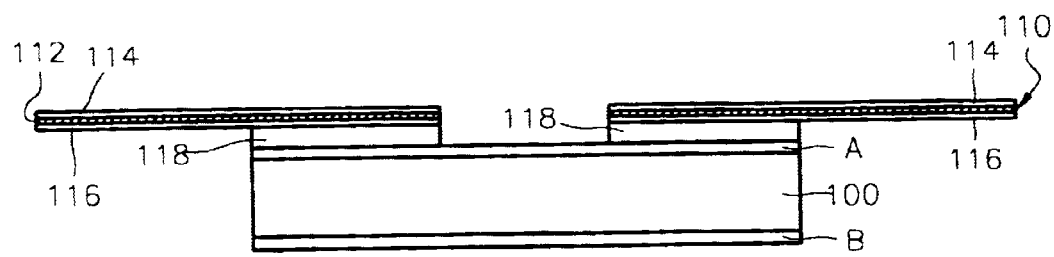
FIGS. 3 through 9 illustrate cross-sectional views explaining stages in a method of fabricating the semiconductor package shown in FIG. 2.

Referring to FIG. 3, a semiconductor chip 100 having integrated circuitry on both sides thereof, i.e., the first and second sides A and B, is manufactured, and then, a sawing process is performed on the semiconductor chip 100, which is a semiconductor wafer, to divide it into several pieces. Next, the first side A of a divided semiconductor chip 100 is bonded with an LOC-type substrate 110, using an elastomer 118. The LOC-type substrate 110 includes a polyimide tape 112 at a center thereof and metal patterns, such as a bonding finger, on first 116 and second 114 sides thereof.

Figure 4:
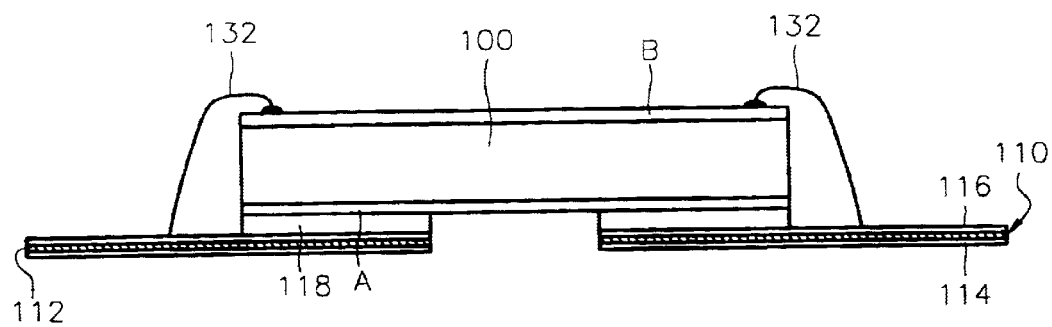

Referring to FIG. 4, the semiconductor package, which is the semiconductor chip 100 bonded with the LOC-type substrate 110, is inverted, and then wire bonding is performed on the inverted semiconductor package, using second wires 132. The wire bonding is to connect a bonding pad (not shown) at an edge of the second side B of the semiconductor chip 100 to a bonding finger on the first side 116 of the LOC-type substrate 110, with gold wires. If the second side B of the semiconductor chip 100 also has a bonding pad at a center thereof, it is possible to change the design of the semiconductor chip 100 through a wafer manufacturing process in which the bonding pad is moved to the edge of the second side B.

Figure 5:
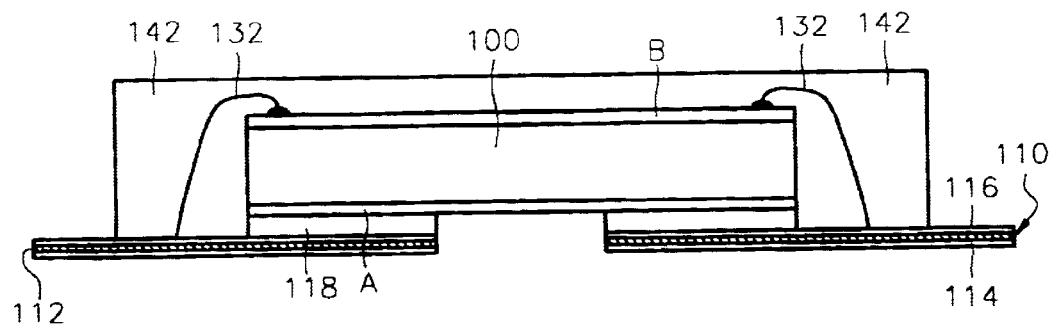

Referring to FIG. 5, the semiconductor package, on which wire bonding is completed, is loaded into a moulding machine, and then, a first sealing process is performed on the semiconductor package, using a second sealing material 142, such as EMC. As a result, the semiconductor chip 100, the second wires 132, and the first side 116 of the LOC-type substrate 110 are covered with the EMC, thereby protecting those components from external shocks.

Figure 6:
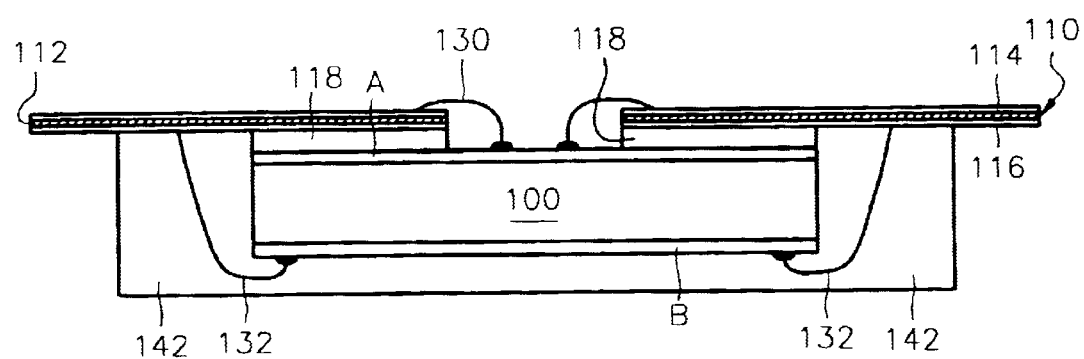

Referring to FIG. 6, the semiconductor package on which the first sealing process is completed, is inverted again, and then wire bonding is performed on it once more. Through the wire bonding, a bonding pad at the center of the first side A of the semiconductor chip 100 and a bonding finger on the second side 114 of the LOC-type substrate 110 are connected with gold wires, i.e., first wires 130.

Figure 7:
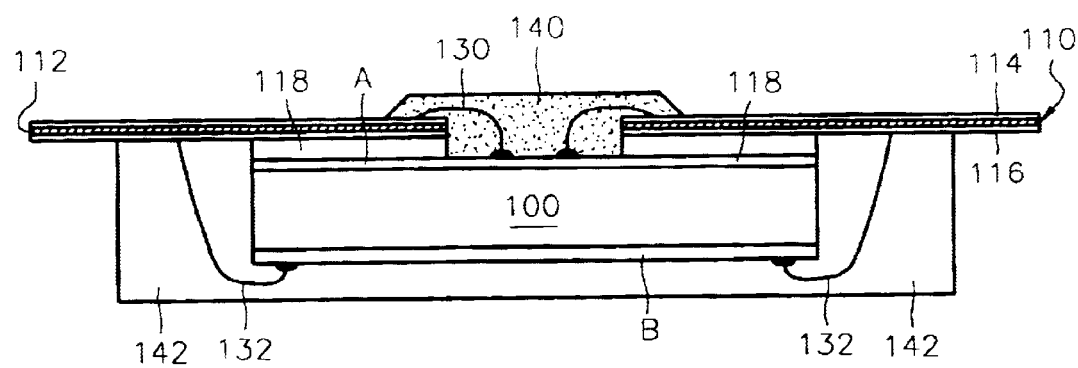

Referring to FIG. 7, a second sealing process is performed on the semiconductor package on which the wire bonding is completed. During the second sealing process, a first sealing material 140, such as liquid encapsulant, is applied onto a portion of the exposed first side A of the semiconductor chip 100, the first wires 130, and a portion of the second side 114 of the LOC-type substrate 110, using a dispenser. When the applied first sealing material 140 hardens, it protects the exposed first side A, the first wires 130, and the portion of the second side 114 from outer shocks.

Figure 8:
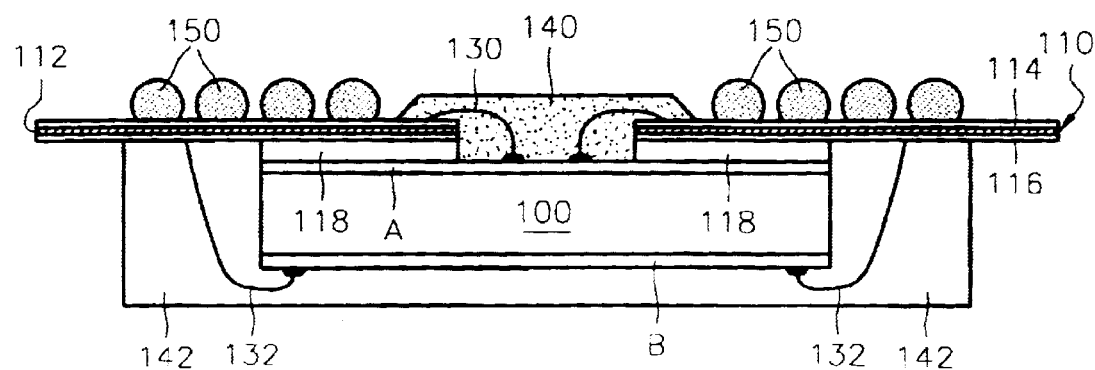

Referring to FIG. 8, solder balls 150 are attached to the semiconductor package on which the second sealing process is completed, in particular, on the second side 114 of the LOC-type substrate 110. The solder balls 150 correspond to the bonding fingers on the metal patterns at the first side 116 and the second side 114 of the LOC-type substrate 110.

Figure 9:
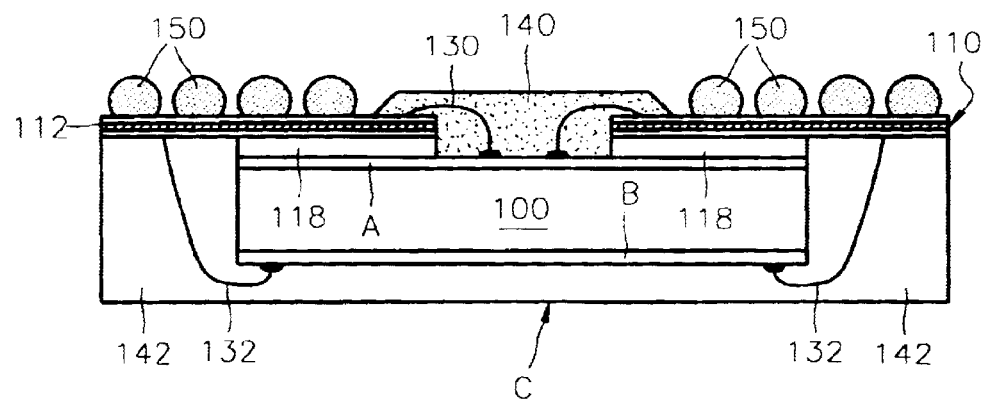

Referring to FIG. 9, a marking process is carried out on the semiconductor package having the solder balls 150. During the marking process, the part type and manufacturing company of a product are marked on the product. Here, this process is performed on an exposed side C of the second sealing material 142. A plurality of semiconductor packages, on which the marking process has to be performed, are combined with one another in a strip. After the marking process, a singulation process is performed on a semiconductor strip to separate the semiconductor packages.

As describe above, according to the present invention, a semiconductor package is fabricated including a double-faced semiconductor chip having integrated circuitry on both sides thereof and thus has advantages in that (i) the integration density of the semiconductor chip is increased and the thickness and size of the semiconductor package are reduced; (ii) functions of the semiconductor package can be increased with the use of a semiconductor chip having two different integrated circuits on both sides; and (iii) problems of a conventional semiconductor chip, such as delamination or the occurrence of voids between two different semiconductor chips, can be prevented, thereby increasing the reliability of the semiconductor package.

A preferred embodiment of the present invention has been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor package including a double-faced semiconductor chip having a first and a second side, the method comprising:

preparing the semiconductor chip, wherein the semiconductor chip has integrated circuitry on the first and second sides thereof;

attaching a lead-on-chip (LOC)-type substrate having a first and a second side and having metal patterns on both sides thereof, to the first side of the semiconductor chip with an adhesive;

performing wire bonding in which a bonding pad on the second side of the semiconductor chip is connected to the metal pattern on the first side of the LOC-type substrate, with one of a plurality of second wires;

performing a first sealing process in which a second sealing material is applied to the semiconductor chip, the plurality of second wires, and the first side of the LOC-type substrate;

performing wire bonding in which a bonding pad on the first side of the semiconductor chip, which is exposed by the LOC-type substrate, is connected to metal pattern on the second side of the LOC-type substrate, with one of a plurality of first wires;

performing a second sealing process in which a first sealing material is applied to the exposed first side of the semiconductor chip, the plurality of first wires, and a portion of the second side of the LOC-type substrate; and attaching a plurality of solder balls to the second side of the LOC-type substrate.

2. The method as claimed in claim 1, wherein the integrated circuitry formed on the first side of the semiconductor chip has the same function as the integrated circuitry formed on the second side of the semiconductor chip.

3. The method as claimed in claim 1, wherein the integrated circuitry formed on the first side of the semiconductor chip has a different function from the integrated circuitry formed on the second side of the semiconductor chip.

4. The method as claimed in claim 1 wherein the bonding pad is at a center of the first side of the semiconductor chip.

5. The method as claimed in claim 1 wherein the bonding pad is at an edge of the second side of the semiconductor chip.

6. The method as claimed in claim 1 wherein the adhesive that connects the semiconductor chip to the LOC-type substrate is formed of elastomer.

7. The method as claimed in claim 1, wherein the LOC-type substrate is formed of polyimide tape.

8. The method as claimed in claim 1, wherein the first sealing process using the second sealing material is carried out using molding equipment.

9. The method as claimed in claim 1, wherein the second sealing process using the first sealing material is carried out using a dispenser.

10. The method as claimed in claim 1, further comprises:

performing a marking process on the surface of the second sealing material after attaching the plurality of solder balls.

11. The method as claimed in claim 10, further comprises:

performing a singulation process of separating a plurality of LOC-type substrates that are combined with one another in a strip, after performing the marking process.

12. The method as claimed in claim 1, wherein each of the metal patterns on the first and second sides of the LOC-type substrate is a bonding finger.

* * * * *